United States Patent [19]

Noguchi

[11] Patent Number: 5,068,262

[45] Date of Patent: Nov. 26, 1991

[54] RESIN COMPOSITION CURABLE WITH AN ACTIVE ENERGY RAY CONTAINING PHOTOPOLYMERIZABLE POLYURETHANE

[75] Inventor: Hiromichi Noguchi, Atsugi, Japan

[73] Assignee: Canon Kabushiki Kaisha, Tokyo, Japan

[21] Appl. No.: 244,302

[22] Filed: Sep. 15, 1988

[30] Foreign Application Priority Data

Sep. 16, 1987 [JP] Japan .................. 62-229492
Jun. 29, 1988 [JP] Japan .................. 63-159079

[51] Int. Cl.$^5$ ............... C08L 51/00; C08L 47/00; C08L 33/04; C08G 63/48
[52] U.S. Cl. ...................... 522/95; 522/109; 525/66; 525/75; 525/77; 525/84; 525/85
[58] Field of Search ............. 522/95, 31, 102, 109; 525/66, 80, 84, 85, 77, 75, 108, 190

[56] References Cited

U.S. PATENT DOCUMENTS

| | | | |
|---|---|---|---|
| 4,688,052 | 8/1987 | Inamoto et al. | 522/31 |
| 4,688,054 | 8/1987 | Inamoto et al. | 522/102 |
| 4,688,055 | 8/1987 | Noguchi et al. | 522/102 |

FOREIGN PATENT DOCUMENTS

| | | | |
|---|---|---|---|
| 0206086 | 12/1986 | European Pat. Off. | 522/102 |
| 3620254 | 12/1986 | Fed. Rep. of Germany | 522/102 |

*Primary Examiner*—Marion E. McCamish
*Assistant Examiner*—Susan Berman
*Attorney, Agent, or Firm*—Fitzpatrick, Cella, Harper & Scinto

[57] ABSTRACT

An improved active energy ray-curing resin composition comprising (i) a graft copolymerized polymer having a number average molecular weight of 5,000 or more and a weight average molecular weight of 50,000 or less: (ii) a linear polymer having a number average molecular weight of 5,000 or more and a weight average molecular weight of 350,000 or less and having a glass transition temperature of 60° C. or more: (iii) an esterified polyurethane obtained from oligoesterdiol or from oligoesterdiol and dihydric isocyanate which has a molecular chain terminal end being esterificated with acrylic acid: and (iv) a photopolymerization initiator.

The resin composition can be desirably cured with an active energy ray such as ultraviolet ray or electron beam and it is capable of being laminated in a desired pattern on a copper-coated laminate for use as a printed board or on a plate of metal, glass, ceramics or plastic.

4 Claims, No Drawings

RESIN COMPOSITION CURABLE WITH AN ACTIVE ENERGY RAY CONTAINING PHOTOPOLYMERIZABLE POLYURETHANE

FIELD OF THE INVENTION

This invention relates to a resin composition curable with an active energy ray such as ultraviolet ray or electron beam. More particularly, it relates to an improved resin composition curable with said active energy ray which is capable of being laminated in a desired pattern on a copper-coated laminate for use as a printed board or on a plate of metal, glass, ceramics or plastic.

BACKGROUND OF THE INVENTION

In recent years, there have been often used various resin compositions curable with an active energy ray in coatings or inks, or as a sealing material, as a resist material, as a material for forming a protective film or as a material for forming a pattern. As such resin compositions, for use in forming a protective film for printed wiring board or for use as a resist material for forming a wiring pattern therefor, there are known, for example, a dry film resist containing a high molecular material capable of forming a film under the trade name of RISTON (produced by Du Pont Japan Ltd.) and a thick film liquid resist according to photographic method under the trade name of PROBIMER (produced by Ciba Geigy Co.).

These known resin compositions comprise mainly (a) high molecular materials contributing to formation of a film or a dry coating and (b) a material curable with an active energy ray. And for these resin compositions, their adhesiveness with a substrate, their developing properties for the formation of a pattern, their durability, painting property and drying property as a paint film are varied depending upon the kinds and the molecular structures of said high molecular materials (a). Therefore, when such resin composition is used aiming at providing the above properties as desired, the kinds of the high molecular materials (a) and the molecular design among the components are properly determined so as to meet the requirements.

However, any of the known resin compositions curable with an active energy is still not sufficient in view of the adhesiveness with various substrates even in the case where it is so designed in the above way.

In order to solve this problem, there have been made proposals to add an auxiliary capable of forming a complex with a metal such as a specific heterocyclic compound or a coupling agent to such resin composition, whereby improving its adhesiveness with a metallic substrate as disclosed in Japanese Laid-open Patent Applications No. 5934/1976 and No. 24035/1983.

However, there is still an unsolved problem in the case of any of these proposals, that the additive will cause oxidation or corrosion on the resin composition after the lapse of time.

Other than the above proposals, there has been proposed a high molecular material comprising a graft copolymerized polymer having polar groups on its graft chains aiming at obtaining a cured composition exhibiting a sufficient adhesiveness with a substrate without addition of such additive as mentioned above by Japanese Laid-open Patent Application No. 283645/1986. The resin composition curable with an active energy ray containing said high molecular material to be provided by this publication is such that it makes it possible to realize an improvement in the adhesiveness of the resulting paint film with a substrate and also in its durability without using such additive as mentioned above.

However, even for such resin composition as described in the above publication, there still remains the unsolved problem of how to determine the molecular structures for the high molecular weight materials to be used in preparing resins having the desired properties. In fact, in general, it is technically difficult to synthesize a desirable graft copolymerized polymer so that it has a predetermined molecular weight and a predetermined content for the graft chains and it has a desired weight average molecular weight in the range from 50,000 to 350,000.

In order to provide desired enhancement in the developing properties upon formation of a pattern, in other words, in the dissolving rate of unpolymerized part, the swelling of polymerized part, the sensitivity as a result of these factors, the sharpness of the resulting pattern and the controlling ability of the resolution, it is necessary for the number average molecular weight of the high molecular material involved to be not excessively small. In the case of a graft copolymerized polymer, to connect a plurality of graft chains having a length sufficient enough to provide an effective adhesiveness with its trunk chain of a relatively large molecular weight to thereby make the resulting graft copolymerized polymer to have a desired number average molecular weight is generally recognized as being difficult because of steric hindrance in this technical field.

In the case where the number average molecular weight of the high molecular material involved is excessively small, when a pattern is formed using such high molecular material, there are limits for the developing properties, that is, the dissolving rate of unpolymerized part, the swelling of polymerized part, the sensitivity as a result of these factors, the sharpness of the resulting pattern and the controlling allowance of the resolution.

SUMMARY OF THE INVENTION

This invention has been accomplished in view of the problems as described above and an object of this invention is to provide an improved resin composition curable with an active energy ray such as ultraviolet ray or electron beam which is capable of being laminated in a desired pattern on a copper-coated laminate for use as a printed board or on a plate of metal, glass, ceramics or plastic.

Another object of this invention is to provide an improved resin composition curable with an active energy ray which exhibits an excellent adhesiveness with a substrate without addition of any auxiliary.

A further object of this invention is to provide an improved resin composition curable with an active energy ray which exhibits excellent developing properties upon formation of a pattern.

A still further object of this invention is to provide an improved resin composition curable with an active energy ray which may be easily controlled so as to exhibit desired properties upon application purposes.

DETAILED DESCRIPTION OF THE INVENTION

The resin composition curable with an active energy ray to attain the above objects of this invention is one that comprises:

(i) a graft copolymerized polymer having a number average molecular weight of 5,000 or more and a weight average molecular weight of 50,000 or less which comprises a trunk chain composed mainly of structural units derived from at least one monomer (hereinafter referred to as "monomer A") selected from the group consisting of alkyl methacrylates, acrylonitrile and styrene and has graft chains having structural units derived from at least one monomer (hereinafter referred to as "monomer B") selected from the group consisting of the monomers represented by the following formula I and other monomers presented by the formula II:

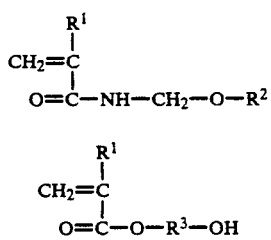

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

(wherein $2 \leq m+n \leq 6$, $n \neq 0$ and $m \neq 0$), or a phenylalkyl group represented by the formula;

(wherein $2 \leq m+n \leq 4$, or the case where $n=0$ or $m=0$ is contained), added to said trunk chain;

(ii) a linear polymer having a number average molecular weight of 50,000 or more and a weight average molecular weight of 350,000 or less and having a glass transition temperature of 60° C. or more which comprises structural units derived from at least one monomer (hereinafter referred to as "monomer C") selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecaneacrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (monomer B) selected from the group consisting of the monomers represented by said formula (I) and the monomers represented by said formula (II);

(iii) an esterified polyurethane obtained from oligoesterdiol or from oligoesterdiol and dihydric isocyanate which has a molecular chain terminal end being esterified with acrylic acid (hereinafter referred to as "photopolymerizable polyurethane"); and (iv) a photopolymerization initiator.

In constituting the above graft copolymerized copolymer (i), specific examples of the monomers to be used for constitution of the trunk chain are such that the main component comprises one or more of alkyl methacrylate, acrylonitrile and styrene as described above. As for the monomers to be used for constitution of the graft chain, in addition to the monomer selected from those represented the foregoing formulas I and II, it is possible to together use a polar monomer selected from the group consisting of acrylic monomers containing amino group or alkylamino group, acrylic or vinyl monomers containing carboxyl group, N-vinylpyrrolidone and its derivatives, and vinylpyridine and its derivatives, in case where necessary. In addition, it is possible to use a hydrophobic monomer as the component of the copolymerization in an amount of about 25 mol % or less.

The above graft copolymerized polymer (i) to be used in the composition of this invention can be prepared according to the known methods, specifically by various methods as disclosed in "Base and Application of Polymer Alloy" p.10–35 (edited by Polymer Society of Japan, published by Tokyo Kagaku Dojin K.K., 1981). Examples of those methods include (1) the chain transfer method, (2) the method by use of radiation, (3) the oxidation polymerization method, (4) the ion graft polymerization method and (5) macromonomer method.

In accordance with any of these methods, the above graft copolymerized polymer (i) can be properly prepared using the foregoing monomers A and B under proper polymerization conditions which make it possible to obtain a desired graft copolymerized polymer having a number average molecular weight of 5,000 or more and a weight average molecular weight of 50,000 or less.

Among the above methods of (1) to (5), the methods of (4) and (5) are preferred since the lengths of the graft chains may be easily uniformed. And, the macromonomer method of (5) is most preferred in view that it is advantageous in design of materials.

The foregoing linear polymer (ii) may be properly prepared in accordance with the conventional polymerization method using the foregoing monomer C as the main component and also using the foregoing monomer B under properly selected polymerization conditions which permit production of a linear polymer having a number average molecular weight of 50,000 or more and a weight average molecular weight of 350,000 or more and having a glass transition temperature of 60° C. or more.

In this case, as for the monomer B, i.e., at least one monomer selected from the group consisting of the monomers represented by the foregoing formula (I) and the monomers represented by the foregoing formula (II), it is preferred to add the monomer B in an amount of 5 to 30 mol % for the following reasons. That is, when more than 30 mol % of the monomer B is incorporated into a linear polymer to be obtained, there are disadvantages that the polar group content in a cured paint film will be undesirably heightened and because of this, any improvement cannot be attained in its adhesiveness with a substrate, and in addition to this, the resulting cured film will be such that is poor in the water proof. On the other hand, when less than 5 mol % of the monomer B is incorporated into a linear polymer to be obtained, not only the adhesiveness with substrate but also the effects of a paint film as the binder will be insufficient.

In order for the resulting linear polymer to have a high glass transition temperature and to contribute in heightening the water proof for the resulting cured film, among the foregoing monomers C, methylmethacrylate, isobornylmethacrylate, isobornylacrylate, tricyclodecaneacrylate or tricyclodecanemethacrylate is most desired.

The foregoing photopolymerizable polyurethane (iii) to be used in the resin composition according to this invention includes oligoesterurethaneacrylates and oligoetherurethane-acrylates.

The photopolymerizable polyurethane (iii) may be prepared selectively using the following materials (a) to (d):

(a) 2-hydroxyethyl(meth)acrylate represented by the formula:

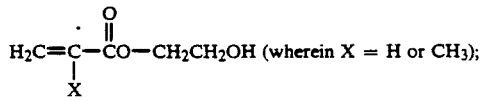

(wherein X = H or CH$_3$);

(b) dihydric isocyanate;
(c) oligoesterdiol represented by the formula:

(d) oligoetherdiol represented by the formula:

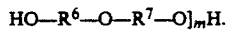

That is, an oligoesterurethaneacrylate may be prepared by reacting the above material (c) with the above material (b) to obtain a reaction product then reacting the reaction product with the above material (a). And an oligoether-urethaneacrylate may be prepared by reacting the above material (d) with the above material (b) to obtain a reaction product then reacting the reaction product with the above material (a).

Examples of the dihydric isocyanate (b) are, for example, tolylene diisocyanate, hexamethylene diisocyanate, diphenylmethane diisocyanate, lysine diisocyanate, isophorone diisocyanate, xylenediisocyanate, dicyclohexanemethane diisocyanate, trimethylhexanemethylene diisocyanate, etc.

In the above formula for the oligoesterdiol, R$^4$ is a dihydric alcohol group. As the dihydric alcohol, there can be mentioned ethylene glycol, diethylene glycol, neopentyl glycol, 1,4-pentanediol, 1,6-hexanediol, bisphenol A, polyethylene glycol, polypropylene glycol, tetramethylene glycol, polytetramethylene glycol, hydroxyl group-ended depolymerized rubber, silicondiol, etc. R$^5$ is a dibasic acid residue. As the dibasic acid, there can be mentioned adipic acid, phthalic acid, succinic acid, glutaric acid, sebacic acid, pimeric acid, azelaic acid, isophthalic acid, etc. In the formula for the oligoetherdiol (d), R$^6$ and R$^7$ show respectively an polyether residue and they represent respectively an alkyl chain of a ring-opening polymer of ethylene oxide, propylene oxide or tetrahydrofuran.

Examples of the photopolymerizable polyurethane (iii) obtained in the way as above mentioned are, for example, a polyurethane acrylate obtained by reacting 1,10-decanediol with isophoron diisocyanate to a reaction product, followed by reacting with 2-hydroxybutyl methacrylate: a polyurethane acrylate by reacting polyesterpolyol obtained from neopentyl glycol and adipic acid with isophorone diisocyanate to obtain a reaction product, followed by reacting with 2-hydroxyethyl acrylate: a polyurethane acrylate obtained by reacting alcohol derived from bisphenol A obtained by the addition 2 mol. of propylene oxide thereto with tolylene diisocyanate to obtain a reaction product, followed by reacting with 2-hydroxyethyl acrylate: a polyurethane acrylate obtained by reacting hydroxypivalyl pivalate with 1,6-hexanediol diisocyanate to obtain a reaction product, followed by reacting with 3-chloro-2-hydroxypropylmethyacrylate; and the like.

And commercially available examples of the photopolymerizable polyurethane (iii) are, for example, ARONIX M-1100 and M-1200 (produced by Toagosei Chemical Industry Co., Ltd.) which are represented by the general formula: $CH_2=CHCOO-R'-OOCN-H-R-NHCOO-polyol-OOCNH]_nR-NH-COO-R'-OOCCH=CH_2$, NK Ester U-108-A (difunctional polyurethane) and NK Ester U-4HA (tetrafunctional polyurethane)(produced by Shinnakamura Chemical Industry Co., Ltd.), and PHOTOMER 6008 (produced by SAN NOPCO K.K.).

It is possible for the said photopolymerizable polyurethane (iii) to contain an appropriate reactive dilution monomer of low viscosity.

The foregoing photopolymerization initiator (iv) includes benzyl ether, benzylmethylketal (e.g. Irugacure 651, produced by Ciba Geigy Co.): benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis (N,N-diethylamino)benzophenone, benzophenone methyl ether and the like; anthraquinones such as 2-ethylanthraquinone, 2-tert-butylanthraquinone and the like; xanthones such as 2,4-dimethylthioxanthone, 2,4-diisopropylthioxathone and the like; acetophenones such as 2,2-dimethoxy-2-phenylacetophenone, α, α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-on (e.g. Darocure 1116, produced by Merck Co.): 2-hydroxy-2-methyl-1-phenylpropane-1-on (e.g. Darocure 1173, produced by Merck Co.): etc., as preferable ones.

In addition to these photopolymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamyl ester, etc.

The constitutional ratios of the foregoing graft copolymerized polymer (i), linear polymer (ii), photopolymerizable polyurethane (iii) and photopolymerization initiator (iv) for the active energy ray-curing resin composition according to this invention are properly determined upon the application purpose.

In a preferred embodiment, the weight ratio of the graft copolymerized polymer (i) to the linear polymer (ii) is desired to be such that (i):(ii) is in the range of from 80:20 to 50:50 in parts by weight.

This situation is an important factor for the active energy ray-curing resin composition according to this invention to exhibit a desired adhesiveness to a substrate based on the graft copolymerized polymer (i) and a desired patterning property based on the linear polymer (ii).

In addition to the above, the weight ratio of the sum amount of the graft copolymerized polymer (i) and the linear polymer (ii) to the photopolymerizable polyurethane (iii) is desired to be such that (i).-(ii):(iii) is in the range of from 100:50 to 100:200 in parts by weight.

Further, the weight ratio of the sum amount of the graft copolymerized polymer (i), the linear polymer (ii) and the photopolymerizable polyurethane (iii) to the photopolymerization initiator (iv) is desired to be such that [(i)+(ii)+(iii)]:(iv) is in the range of from 100:1 to 100:10 in parts by weight.

In the case where the foregoing photopolymerization accelerator (v) is used in addition to the photopolymerization initiator, the weight ratio of the sum amount of the above (i), (ii) and (iii) to the sum amount of the above (iv) and (v) is desired to be such that [(i)+(ii)+(iii)]:[(iv)+(v)] is in the range of from 100:1 to 100:10 in parts by weight.

The active energy ray-curing resin composition according to this invention may further contain additives such as catalysts for condensation crosslinking, heat polymerization inhibitors, colorants such as dyes and pigments, fillers, heat stabilizers such as hydroquinone or paramethoxyphenol, adhesion promotors, plasticizers, moistureproof pigments such as silica or talc, leveling agents of imparting coating suitability, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant, there can be added oil-soluble dyes and pigments within the range which do not substantially prevent transmission of the active energy ray. As the filler, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used.

As the solvent to be used when employing the active energy ray-curing resin composition for formation of a resin cured film in the form of a liquid or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the resin composition after patterning.

The active energy ray-curing resin composition according to this invention as explained above may be applied onto a substrate in accordance with any of the conventional methods. Specific examples of such method will be below illustrated:

(1) In the case of forming a cured film coat on a substrate, the active energy ray-curing resin composition is liquid state is applied onto the substrate to form a liquid coat thereon which is followed by evaporation to dryness, then the resultant dried coat is cured by irradiating it with an active energy.

(2) In the case of forming a protective cured layer in the form of a desired pattern on a substrate, the active energy ray-curing resin composition in liquid state is applied onto the substrate to form a liquid coat thereon which is followed by evaporation to dryness, the resultant dry layer is scanned with laser beam in a desired pattern, and the unexposed portion is etched off with a proper solvent such as 1,1,1-trichloroethane to thereby form a protective cured layer in the form of a desired pattern on the substrate.

(3) In the case of forming a protective cured layer coat in the form of a desired pattern on a substrate, the active energy ray-curing resin composition in liquid state is applied onto the substrate to form a liquid coat thereon which is followed by evaporation to dryness, a photomask having a pattern with a desired shape which does not transmit any active energy ray is superposed on the resultant dry film layer, then exposure with an active energy ray is effected from above the photomask, and the unexposed portion is removed by a proper solvent such as 1,1,1-trichloroethane to thereby form a protective cured layer in the form of a desired pattern on the substrate.

(4) In the case of forming a photosensitive dry film and laminating said dry film on a substrate, the active energy ray-curing resin composition in liquid state is applied onto a polyethylene terephthalate film to form a liquid coat thereon which is followed by evaporation dryness, whereby obtaining a photosensitive dry film on the said polyethylene terephthalate film, the resultant is laminate onto a substrate in accordance with the conventional lamination method to obtain a laminate, and the photosensitive dry film as laminated on the substrate is cured by irradiating it with an active energy ray in the same way as in the above method (1).

If the resulting cured photosensitive film is desired to have been shaped in a desired pattern, the above dry film as laminated on the substrate is treated in the same way as the above method (2) or (3).

In the case where the active energy ray-curing resin composition is one that contains the monomer represented by the foregoing formula (1), the cured film as obtained in any of the above methods (1) to (4) is desired to be further subjected to heat-treatment at a temperature of 80° C. to 200° C. to thereby condensedly cure it.

The active energy ray to be used for curing the active energy ray-curing resin composition of this invention or for the pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20M Rad is practically suitable.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

1. Provision of each of the components (i) to (iv) for the preparation of a active energy ray-curing resin composition of this invention Preparation of a graft copolymerized polymer (i)

Radical chain transfer polymerization of 50 parts by weight of 2-hydroxybutylmethacrylate and 50 parts by weight of N-methylolacrylic amide was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 3,000 for the number average molecular weight of the resultant macromonomer.

Solution polymerization of 20 parts by weight of the said macromonomer and 80 parts by weight of methylmethacrylate was carried out in methyl cellosolve solvent to thereby obtain a thermosetting graft copolymerized polymer having a weight average molecular weight of about 40,000 and a number average molecular weight of about 10,000.

A linear polymer (ii)

There was provided a linear acrylic copolymer obtained by polymerizing methylmethacrylate 2-hydroxybutylmethacrylate and N-methylolacrylic amide in the molar ratio of 80:10:10. This linear acrylic copolymer is one that has a number average molecular weight of about 100,000 and a weight average molecular weight of about 270,000.

A photopolymerizable polyurethane (iii)

There was provided a photopolymerizable polyurethane of 2000 molecular weight comprised of (a) copolymer (molecular weight: 200) dicyclohexyl diisocyanate and polypropylene glycol and (b) 2-hydroxyethylacrylate.

A photopolymerization initiator (iv)

There was provided benzylmethylketal under the trade name of Irugacure 651 (produced by Ciba Geigy Co.).

2. Preparation of an active energy ray-curing resin composition of this invention The above components (i) to (iv) were well mixed by the weight ratios as below shown in accordance with the conventional mixing technique to thereby obtain the active energy ray-curing resin composition, in which there were used the additives as below shown.

| Component | Parts by weight |
| --- | --- |
| (i) | 50 |
| (ii) | 50 |
| (iii) | 120 |
| (vi) | 7 |
| Crystal Violet | 0.1 |
| methyl ethyl ketone | 250 |

3. Preparation of a resin cured film

The thus obtained active energy ray-curing resin composition in liquid state was applied onto the cleaned surface of a Pyrex glass plate under the trade name of Corning 7740 (produced by Corning Glass Wear Co.) to form a liquid coat of about 80 $\mu$m in thickness, followed by air-dryness at 100° C. for 15 minutes to obtain a dry film of about 40 $\mu$m on the glass plate.

The glass plate having said dry film thereon was exposed to active energy rays with maximum irradiation energy of 100 mW/cm$^2$ from the conventional ultra-high pressure mercury lamp for 10 seconds. Thereafter, it was heat-treated at 150° C. for 30 minutes.

The resultant was subjected to reflux treatment in 1% caustic soda aqueous solution for 10 hours.

The thus obtained laminate was tested and as a result, it was found that the exposed (cured) resin film is firmly adhered to the glass plate, and there were not observed any chloroisis or bulging phenomena on the resultant film even after storage for a long period of time.

EXAMPLE 2

1. Provision of each of the components (i) to (iv) for the preparation of an active energy ray-curing resin composition of this invention Preparation of a graft copolymerized polymer (i)

The procedures for the preparation of the macromonomer in Example 1 were repeated, except that there were used 50 parts by weight of 2-hydroxypropylmethacrylate and 50 parts by weight of butoxymethylacrylamide, to thereby obtain a macromonomer having a methacryloyl group at one terminal end of the molecular chain.

The result of the measurement by the known GPC method gave a value of about 2,000 for the number average molecular weight of the resultant macromonomer.

Solution polymerization of 30 parts by weight of the said macromonomer and 70 parts by weight of methylmethacrylate was carried out in a solvent containing methyl cellosolve and methylethyl ketone in the weight ratio of 60:40 to thereby obtain a thermosetting graft copolymerized polymer having a number average molecular weight of about 7,000 and a weight average molecular weight of about 25,000.

A linear polymer (ii)

There was provided a linear acrylic copolymer obtained by polymerizing methylmethacrylate, isobornylmethacrylate and butoxymethylacrylamide in the molar ratio of 70:20:10. This linear acrylic copolymer is one that has a number average molecular weight of about 150,000 and a weight average molecular weight of about 320,000.

A photopolymerizable polyurethane (iii)

There was provided a photopolymerizable polyurethane of 1300 molecular weight comprised of (a) copolymer (molecular weight: 600) of hexamethylene diisocyanate, propylene oxide and tetrahydrofuran and (b) 2-hydroxyethylacrylate.

A photopolymerization initiator (iv)

There were provided the following two kinds of materials (vi)-(1) and (iv)-(2):
(iv)-(1): benzophenone
(iv)-(2): paradiethylaminobenzophenone

2. Preparation of an active energy ray-curing resin composition of this invention.

The above components (i) to (iv)-(2) were well mixed by the weight ratios as below shown in accordance with the conventional mixing technique to thereby obtain the active energy ray-curing resin composition, in which there were used the additives as below shown.

| Component | Parts by weight |
| --- | --- |
| (i) | 80 |
| (ii) | 20 |
| (iii) | 110 |
| (iv)-(1) | 8 |
| (iv)-(2) | 1 |
| Crystal Violet | 0.1 |
| methyl ethyl ketone | 150 |
| methyl isobutyl ketone | 100 |

3. Preparation of a protective resin cured film on a printed board

On a printed board comprising conductor circuit composed of 60 μm thick copper foil formed on a glass cross epoxy resin substrate, there was formed a liquid coat of the thickness to be 50 μm when dried by applying the resin composition in liquid state obtained in the above step 2 by way of the conventional roll coater. The liquid coat was then air-dried at 100° C. for 3 minutes.

After cooling, a solder mask pattern was superposed on the dry film and subjected to pattern exposure for 60 seconds using the conventional ultra-high pressure mercury lamp of generating collimated UV ray, the luminous flux density of the UV ray from which is to be 7 mW/cm² near 365 nm and the collimation amplitude is to be 3°. After completion of the exposure, the resultant was engaged in spray-development with 1,1,1-trichloroethane at 20° C. for 50 seconds. The development was stably proceeded and as a result, there was formed a clear pattern. After completion of the development, the cured dry film on the printed board was air-dried and further irradiated with UV ray from the above mercury lamp for 5 minutes, followed by heat-treatment at 150° C. for 15 minutes to thereby complete the formation of a patterned resin cured protective film on the printed board.

As a result of examining the resultant protective film, it was found that the film is excellent in the resistance against not only acids but also alkalis and also in the resistance against other chemicals.

EXAMPLE 3

The procedures for the preparation of the active energy ray-curing resin composition in Example 2 were repeated, except that the weight ratio of the methy ethyl ketone and that of the methyl isobutyl ketone were changed to 200 and 50 parts by weight respectively, to thereby obtain an active energy ray-curing composition.

The resultant resin composition in liquid state was applied on a 25 μm thick polyethyleneterephthlate film (trade name: Lumirror-T type, Toray K.K.) by way of the conventional reverse coater to form a liquid coat of the thickness to be 25 μm when dried. Using a 40 μm thick drawn polyethylene film as the cover film, there was prepared a laminate having a dry photopolymerizable composition layer being sandwiched between the two films. On a laminate comprising a 35 μm thick copper foil disposed on a paper phenol member, the said layer was laminated while removing the polyethylene film using the conventional laminator at 95° C. for the roll temperature and at 0.5 m/min for the peripheral speed. Then, a negative mask film made of polyester for printed board pattern was vacuum superposed on the resultant, followed by exposure to UV ray for 50 seconds in the same way as in Example 2. After completion of the exposure, the polyethyleneterephthalate film was removed, and the resultant was engaged in spray-development with 1,1,1-trichaloroethane at 20° C. for 30 seconds to form a resist film in wiring pattern.

The copper foil coated laminate having the resultant resist film was etched with a FeCl₃ solution of 45 Baume at 45° C. for 2 minutes to thereby dissolve unnecessary portion of the copper foil. Then, the resultant was subjected to ultrasonic cleaning in dichloromethane to remove the said regist film. As a result, there was obtain a precision conductor circuit of 80 μm in line width and 80 μm in space which is equivalent to the wiring pattern.

What we claim is:

1. A resin composition curable with an active energy ray comprising:
    (i) a graft copolymerized polymer having a number average molecular weight of 5,000 or more and a weight average molecular weight of 50,000 or less which comprises a trunk chain composed mainly of structural units derived from at least one monomer selected from the group consisting of alkyl methacrylates, acrylonitrile and styrene and has graft chains having- structural units derived from at least one monomer selected from the group consisting of the monomers represented by the following formula I and other monomers presented by the formula II:

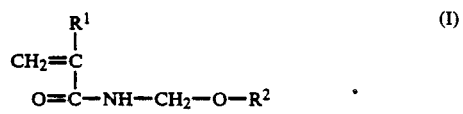

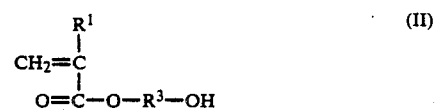

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

(wherein $2 \leq m+n \leq 6$, $n \neq 0$ and $m \neq 0$), or a phenylalkyl group represented by the formula:

(wherein $2 \leq m+n \leq 4$, or the case where $n=0$ or $m=0$ is contained), added to said trunk chain;

(ii) a linear polymer having a number average molecular weight of 50,000 or more and a weight average molecular weight of 350,000 or less and having a glass transition temperature of 60° C. or more which comprises structural units derived from at least one monomer selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer in amounts from 5 to 30 mole percent selected from the group consisting of the monomers represented by said formula (I) and the monomers represented by said formula (II);

(iii) an esterified polyurethane obtained from oligoesterdiol or from oligoesterdiol and dihydric isocyanate which has a molecular chain terminal end being esterified with acrylic acid: and (iv) a photopolymerization initiator.

2. The resin composition according to claim 1, wherein the weight ratio of said graft copolymerized polymer (i) to said linear polymer (ii) to said linear polymer (ii) is such that (i):(ii) is in the range from 80:20 to 50:50.

3. The resin composition according to claim 1, wherein the weight ratio of the sum weight of said graft copolymerized polymer (i) and said linear polymer (ii) to said esterified polyurethane (iii) is such that [(i)+(ii)]:(iii) is in the range from 100:50 to 100:200.

4. The resin composition according to claim 1, wherein the weight ratio of the sum of said graft copolymerized polymer (i), said linear polymer (ii) and said esterified polyurethane (iii) to said photopolymerization initiator (iv) is such that [(i)+(ii)+(iii)]:(iv) is in the range from 100:1 to 100:10.

* * * * *

UNITED STATES PATENT AND TRADEMARK OFFICE
CERTIFICATE OF CORRECTION

PATENT NO. : 5,068,262
DATED : November 26, 1991
INVENTOR(S) : HIROMICHI NOGUCHI It is certified that error appears in the above-identified patent and that said Letters Patent is hereby corrected as shown below:

COLUMN 3

Line 12, "presented" should read --represented--.
Line 37, "formula;" should read --formula:--.
Line 56, "tricyclodecaneacrylate," should be deleted.

COLUMN 4

Line 9, "represented" should read --represented by--.

COLUMN 5

Line 33, "HO—$R^6$—O—$R^7$—O]$_m$H." should read --HO-[$R^6$—O—$R^7$—O]$_m$H.--.
Line 60, "an" should read --a--.

COLUMN 6

Line 19, "H—R—NHCOO—polyol—OOCNH]$_n$R—NH-" should read
--H-[R—NHCOO-(polyol)-OOCNH]$_n$R—NH- --.
Line 47, "Co.):" should read --Co.);--.
Line 49, "Co.):" should read --Co.);--.

COLUMN 7

Line 10, "(i).-(ii):(iii)" should read --[(i)+(ii)]:(iii)--.

COLUMN 8

Line 4, "is" should read --in--.
Line 39, "laminate" should read --laminated--.

UNITED STATES PATENT AND TRADEMARK OFFICE
CERTIFICATE OF CORRECTION

PATENT NO. : 5,068,262
DATED : November 26, 1991
INVENTOR(S) : HIROMICHI NOGUCHI It is certified that error appears in the above-identified patent and that said Letters Patent is hereby corrected as shown below:

COLUMN 9

Line 14, "a" should read --an--.

COLUMN 10

Line 6, "(vi)" should read --(iv)--.
Line 16, "Wear" should read --Ware--.
Line 18, "air-dryness" should read --air-drying--.
Line 30, "chloroisis or" should be deleted.

COLUMN 11

Line 11, "(vi)-(1)" should read --(iv)-(1)--.
Line 68, "methy" should read --methyl--.

COLUMN 12

Line 24, "1,1,1-trichaloroethane" should read
--1,1,1-trichloroethane--.
Line 31, "regist" should read --resist-- and
"obtain" should read --obtained--.
Line 35, "we" should read --I--.
Line 46, "having-" should read --having--.
Line 49, "presented" should read --represented--.

UNITED STATES PATENT AND TRADEMARK OFFICE
CERTIFICATE OF CORRECTION

PATENT NO. : 5,068,262
DATED : November 26, 1991
INVENTOR(S) : HIROMICHI NOGUCHI Page 3 of 3

It is certified that error appears in the above-identified patent and that said Letters Patent is hereby corrected as shown below:

<u>COLUMN 14</u>

Line 13, "to said linear" (second occurrence) should be deleted.
    Line 14, "polymer (ii)" should be deleted.

Signed and Sealed this

Twelfth Day of October, 1993

Attest:

BRUCE LEHMAN

Attesting Officer     Commissioner of Patents and Trademarks